United States Patent
Yasui et al.

(10) Patent No.: US 7,796,050 B2
(45) Date of Patent: Sep. 14, 2010

(54) ABNORMAL CIRCUIT OPERATION DETECTION SYSTEM

(75) Inventors: Takanori Yasui, Yokohama (JP);
Masato Hashizume, Yokohama (JP);
Yoshihisa Ikeda, Yokohama (JP);
Chikashi Hashimoto, Yokohama (JP);
Hiroyuki Iwaki, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 646 days.

(21) Appl. No.: 11/207,831

(22) Filed: Aug. 22, 2005

(65) Prior Publication Data
US 2006/0242463 A1 Oct. 26, 2006

(30) Foreign Application Priority Data
Mar. 29, 2005 (JP) .............................. 2005-093946

(51) Int. Cl.
*G08B 21/00* (2006.01)
(52) U.S. Cl. .............................. 340/679; 361/5; 361/90
(58) Field of Classification Search ................. 340/657, 340/658, 659, 661, 662, 663, 664, 679, 680; 361/6, 90, 91.1, 5
See application file for complete search history.

(56) References Cited

U.S. PATENT DOCUMENTS

| | | | | |
|---|---|---|---|---|
| 4,932,246 A * | 6/1990 | Deutsch et al. | .......... | 73/114.45 |
| 5,453,939 A * | 9/1995 | Hoffman et al. | ............ | 702/183 |
| 5,453,969 A * | 9/1995 | Psaltis et al. | ........... | 369/110.01 |
| 5,586,057 A * | 12/1996 | Patel | ........................... | 702/185 |
| 5,983,377 A * | 11/1999 | Knotts | ........................ | 714/726 |
| 6,018,300 A * | 1/2000 | Dowden et al. | ............. | 340/635 |
| 6,157,310 A * | 12/2000 | Milne et al. | .................. | 340/679 |
| 6,217,759 B1 * | 4/2001 | Kolesnikov et al. | ......... | 210/194 |
| 6,271,759 B1 * | 8/2001 | Weinbach et al. | ............ | 340/635 |
| 6,433,698 B1 * | 8/2002 | Schweitzer et al. | ......... | 340/664 |
| 6,667,691 B2 * | 12/2003 | Sapir | ........................... | 340/635 |
| 7,116,239 B2 * | 10/2006 | Muratov et al. | ............. | 340/635 |
| 2003/0218475 A1 * | 11/2003 | Gammel | ........................ | 326/8 |
| 2004/0010649 A1 * | 1/2004 | Weaver et al. | ................ | 710/302 |

FOREIGN PATENT DOCUMENTS

| | | |
|---|---|---|
| JP | 2001-74804 | 3/2001 |
| JP | 2001-287355 | 10/2001 |
| JP | 2004-104879 | 4/2004 |

* cited by examiner

*Primary Examiner*—Davetta W Goins
*Assistant Examiner*—Edny Labbees
(74) *Attorney, Agent, or Firm*—Staas & Halsey LLP

(57) ABSTRACT

An abnormality in operation is detected by meticulously monitoring the operation of a monitored device that comprises a state machine. The state number, indicating the state the monitored device is currently in, is output from the device. The upper and lower limit values of current consumption is set for each state number. A monitoring circuit, using the upper and lower limit values for the present state number, judges the value of current consumption detected by a current detection circuit and detects whether there is abnormality in operation.

8 Claims, 10 Drawing Sheets

ABNORMAL CIRCUIT OPERATION DETECTION SYSTEM

BACKGROUND OF THE INVENTION

1. Field of the Invention

The present invention relates to a system for detecting abnormal operation of an electronic circuit and, more particularly, to an abnormal operation detection system suited to detect abnormal operation of a large-scale integrated circuit device such as an FPGA or an ASIC.

2. Description of the Related Art

In a large-scale integrated circuit device such as an FPGA (Field Programmable Gate Array) or an ASIC (Application Specific Integrated Circuit), a design problem can lead to a fatal problem that causes the circuit to hang up and forces the system to stop. Furthermore, as device miniaturization progresses, there can arise the possibility that, even if there is no design problem, the circuit may malfunction or a deadlock may occur due to a soft error such as the alteration of device logic or bit flipping caused by cosmic rays reaching the earth, and this can result in a fatal problem such as a system stoppage.

In the patent documents 1 to 3 listed below, it is described that abnormal operation is detected by monitoring the power consumption of a monitored unit or device. However, generally, the power consumption of a monitored device during normal operation changes with its internal operating state, but none of these patent documents take account of such factors as the state of the internal state machine of the monitored device, the ambient temperature at which the device is actually operating, and variations among individual devices.

In particular, it is desired that the monitoring of a large-scale integrated circuit device, such as an FPGA or an ASIC, that has a state machine construction defined by a plurality of states and a condition for a state transition be performed meticulously so as to match each of the plurality of states that occur as the state machine makes a state transition.

Patent document 1: Japanese Unexamined Patent Publication No. 2004-104879

Patent document 2: Japanese Unexamined Patent Publication No. 2001-287355

Patent document 3: Japanese Unexamined Patent Publication No. 2001-74804

SUMMARY OF THE INVENTION

Accordingly, it is an object of the present invention to provide an abnormal operation detection system particularly suited for monitoring a monitored device that changes state during operation.

According to one preferred mode of the present invention, there is provided an abnormal operation detection system comprising: a monitored device constructed from a state machine in which a plurality of states, and the conditions for state transitions, are defined, the monitored device having a function to output a state number indicating the state of the state machine; a power consumption detection circuit for detecting power consumption of the monitored device; and a monitoring circuit for determining the presence or absence of abnormality in the power consumption by using an abnormality evaluation value corresponding to the state number output from the monitored device.

Abnormal operation detection can be meticulously performed by making a determination using an abnormality evaluation value that differs according to the state number that the monitored device outputs.

Preferably, the monitoring circuit is constructed to further determine the presence or absence of abnormality in the power consumption by using an accumulated power consumption value, which represents the value of the power consumption accumulated for a predetermined length of time irrespective of the state number, and an abnormality evaluation value predetermined for the accumulated power consumption value.

In one abnormal operation, the monitored device may be unable to change state. If the power consumption at this time happens to be within the range preset for that state, the abnormal operation cannot be detected with the earlier described method that uses the abnormality evaluation value corresponding to the state number. In view of this, by using the abnormality evaluation value for the accumulated power consumption value accumulated irrespective of the state number, as described above, it becomes possible to detect this kind of abnormal operation.

Preferably, the system further comprises a control circuit for sequentially supplying a plurality of test patterns to the monitored device, and the monitoring circuit further determines the presence or absence of abnormality in the power consumption by using an abnormality evaluation value corresponding to the test pattern that the control circuit supplies to the monitored device.

The possibility cannot be ruled out that an erroneous state number is reported due to abnormal operation of the monitored circuit and the abnormal operation therefore goes undetected, or that it is impossible to detect an abnormality in which the current consumption lies within the normal range but the state transition that should occur does not occur, but this possibility can be avoided if provisions are made to apply, from the external control circuit, a test pattern that causes a state change and to measure the power consumption at this time.

DESCRIPTION OF THE PREFERRED EMBODIMENTS

Figure 1:
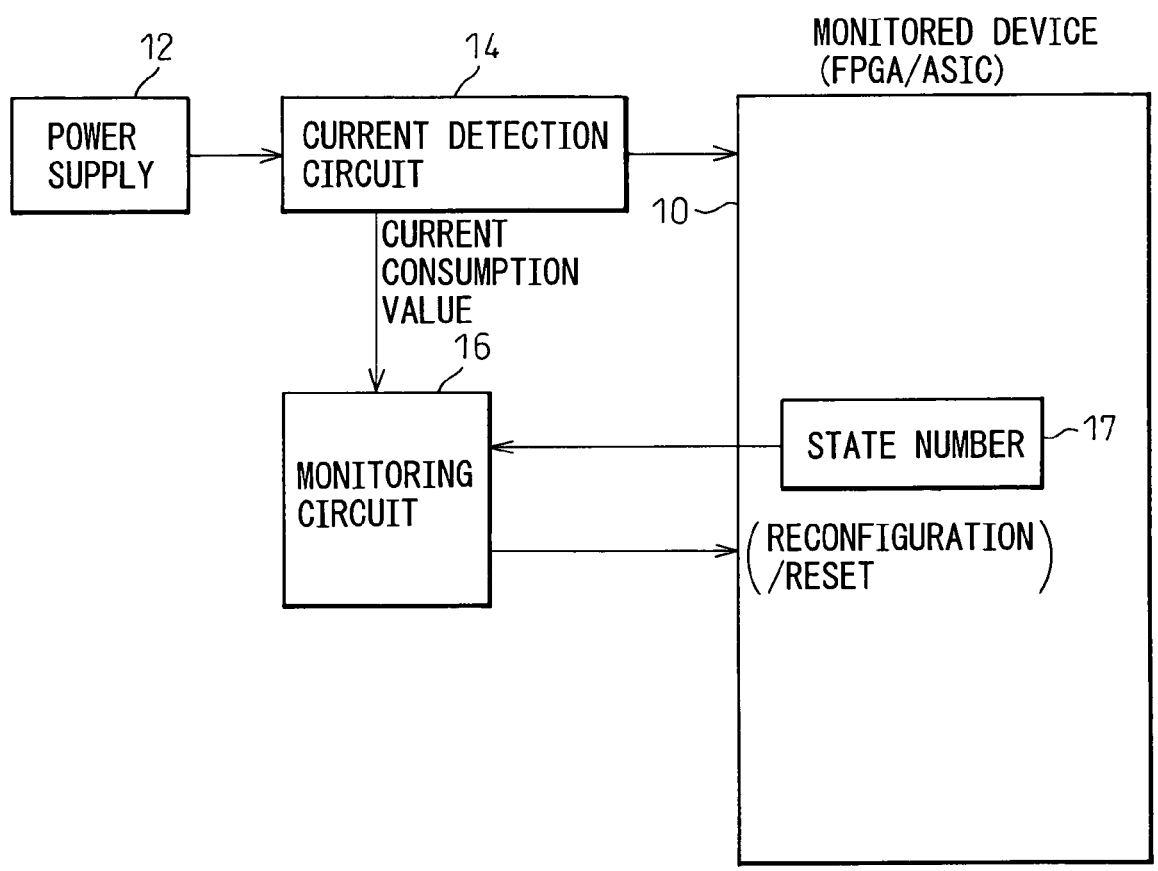
FIG. 1 is a simplified block diagram showing the configuration of a first example of an abnormal operation detection system according to one embodiment of the present invention.

FIG. 1 is a simplified block diagram showing the configuration of an abnormal operation detection system according to one embodiment of the present invention.

The system shown comprises a monitored device 10, a current detection circuit 14 for detecting the power consumption of the monitored device by detecting the current of a constant-voltage DC power supply being supplied from a power supply unit 12 to the monitored device 10, and a monitoring circuit 16 for detecting abnormal operation of the monitored device 10 from the value of the current consumption detected by the current detection circuit 14.

The monitored device 10 is an FPGA (Field Programmable Gate Array) or an ASIC (Application Specific Integrated Circuit), and has a state machine construction which can be represented by a state transition diagram defining a plurality of states and the conditions for state transitions. A state number 17, indicating which state the state machine is currently in, is output via a pin on the device.

The monitoring circuit 16 detects an abnormality in the current consumption value by referring to the abnormality evaluation value corresponding to the state number output from the monitored device 10. When abnormality in operation is detected, the monitoring circuit 16, for example, sends a reset signal to the monitored device 10, whereupon the monitored device 10 is reset to the initial state and is thereafter restored in a sequential manner to the normal operating condition. If the device cannot be restored after resetting a plurality of times, then reconfiguration control is performed to restore the monitored device 10.

The abnormality evaluation values corresponding to the respective state numbers are set, for example, as shown in Table 1 below.

TABLE 1

Examples of abnormality evaluation values corresponding to state numbers

| Transition state | State number | Power consumption (mA) Set value (Expected value) |
|---|---|---|
| Provisioning non-set state | 0 | 100-150 (mA) |
| Shutdown state | 1 | 0 to 20 (mA) |
| ALC power-up state 1 | 3 | 0 to 300 (mA) |
| ALC power-up state 2 | 4 | 200 to 500 (mA) |
| ALC settled state 1 | 5 | 400 to 500 (mA) |
| AGC normal control state | 11 | 650 to 750 (mA) |
| ALC power-up state 3 | 6 | 400 to 750 (mA) |
| ALC settled state 2 | 7 | 400 to 500 (mA) |
| Safelight power-up state | 17 | 650 to 750 (mA) |
| Safelight state | 18 | 150 to 200 (mA) |

Figure 2:
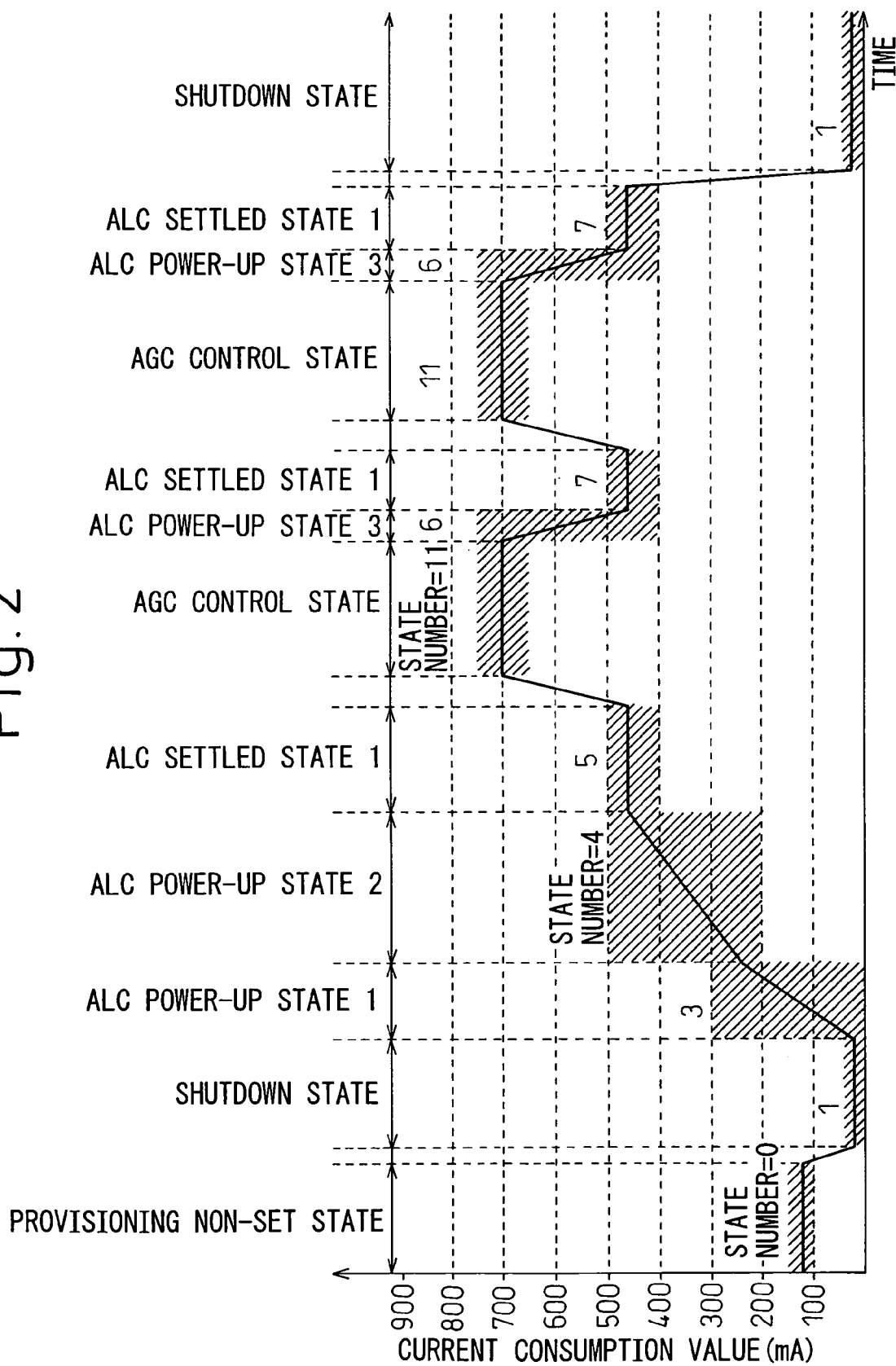
FIG. 2 is a graph showing an example of how current consumption changes with the state transition of a monitored device during normal operation, along with the expected value range for the current consumption.

FIG. 2 shows an example of how the current consumption (that is, the power consumption) changes with the state transition of the monitored device 10 during normal operation. In FIG. 2, the expected value range for the current consumption in each state shown in Table 1 is indicated by hatching. By determining the expected value range according to each state number as shown, the expected value range can be set narrower, and meticulous power consumption monitoring can therefore be accomplished.

In FIG. 2, states not defined on the time axis exist between transition states; these undefined states correspond to non-monitoring periods during which the current consumption is not monitored. The system may be operated by newly defining these states and setting them as monitoring periods, but the example of FIG. 2 has been given to illustrate the case where non-monitoring periods are also present.

Figure 3:
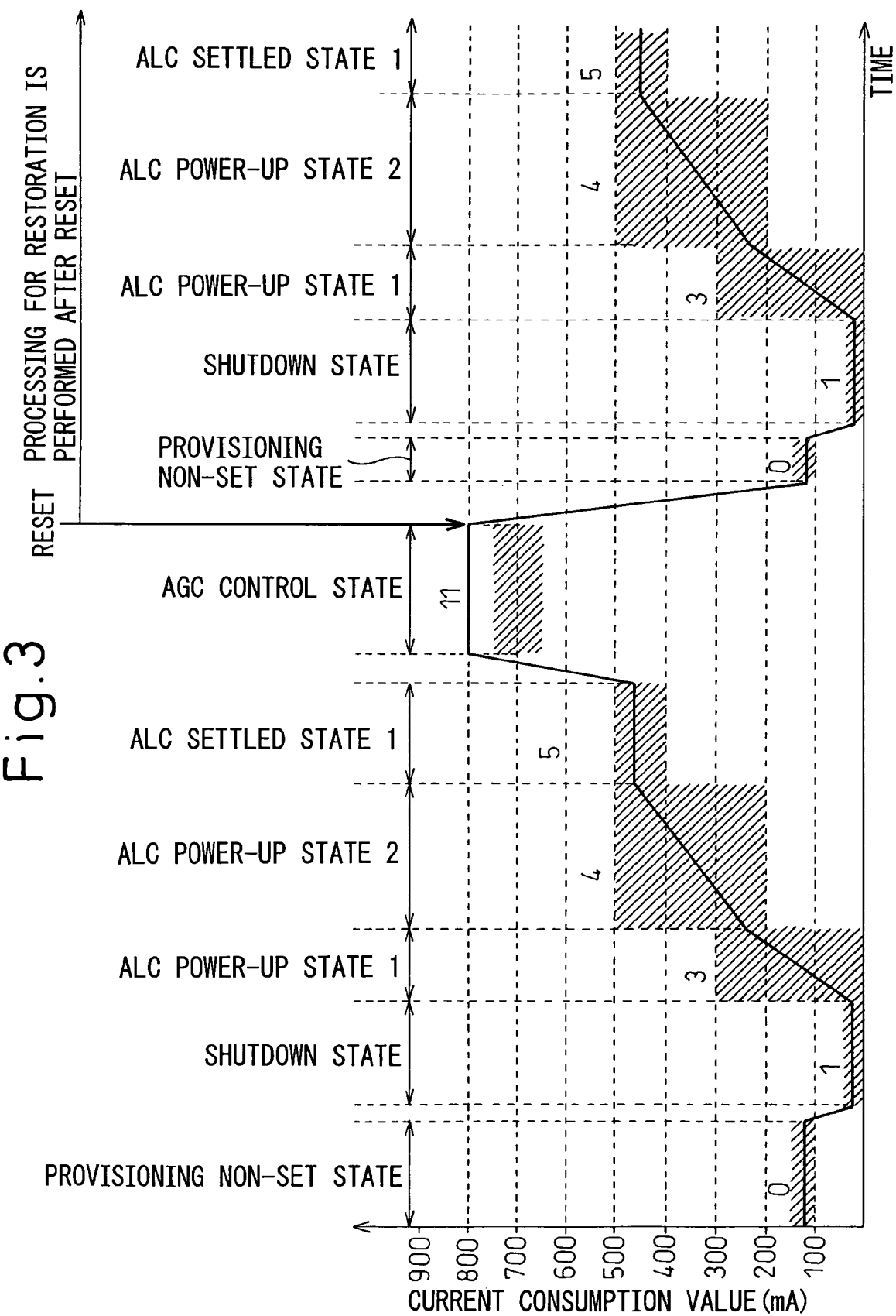
FIG. 3 is a graph showing the state transition and the change of the current consumption when an abnormal operation is detected.

FIG. 3 shows the state transition and the change of the current consumption when an abnormality in operation is detected. In FIG. 3, the current consumption in the AGC control state indicated by the state number 11 rises to 800 mA to exceed the upper limit of the expected value range of 650 to 750 mA, and the monitoring device 16 detects this condition and resets the monitored device 10 to restore it to the normal condition.

Figure 4:
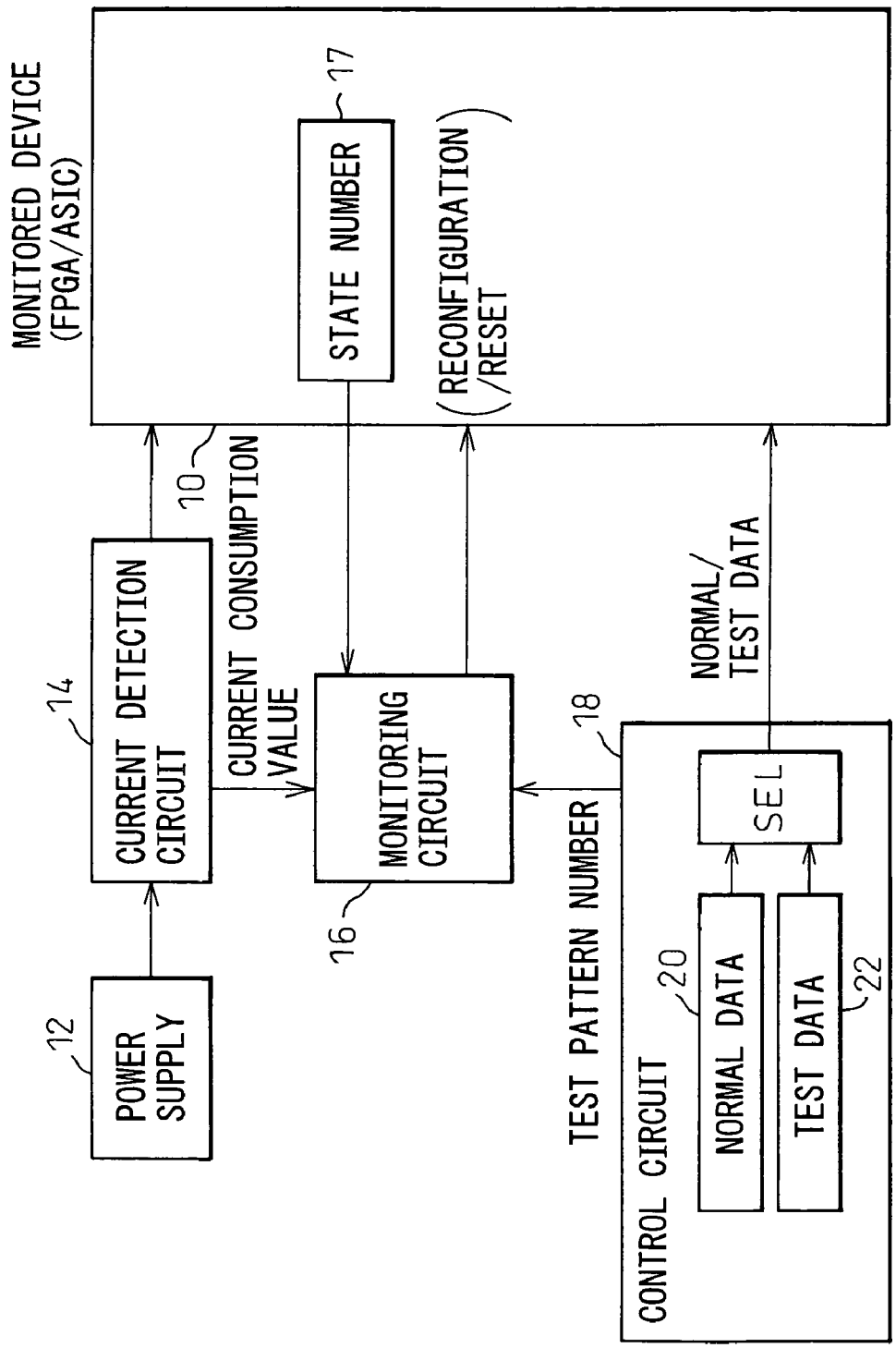
FIG. 4 is a block diagram showing a second example of the abnormal operation detection system.

In the construction of FIG. 1, there can occur a situation where, when the current consumption value is abnormal, an erroneous state number is declared by the monitored device 10 and the abnormality cannot be detected because the detected current consumption value happens to be within the expected value range for that declared state number, or a situation where, while the current consumption value is normal, a deadlock condition occurs and an abnormality, in which a state transition that should occur does not occur, cannot be detected. FIG. 4 shows a second example of the abnormal operation detection system which can avoid such situations.

In FIG. 4, a control circuit 18 is usually provided to control the monitored device 10, and periodically supplies a command, for causing a state transition, as normal data 20 to the monitored device 10. In the present invention, a plurality of test patterns are sequentially supplied as test data 22 to the monitored device 10 during an idle interval between the transmissions of the normal data 20, and the presence or absence of abnormal operation is detected by determining whether the current consumption value corresponding to each test pattern is within the prescribed expected value range. Examples of the expected value ranges corresponding to the respective test patterns are shown in Table 2.

TABLE 2

Examples of expected value ranges set for test patterns

| Test pattern | Power consumption (mA) Set value (Expected value) |
|---|---|
| Test pattern 1 | 100-150 (mA) |
| Test pattern 2 | 150-200 (mA) |
| Test pattern 3 | 200-250 (mA) |
| Test pattern 4 | 250-300 (mA) |
| Test pattern 5 | 400-600 (mA) |

The occurrence of situations where abnormality in operation cannot be detected, as described above, can be avoided by setting the expected value range for each of the plurality of test patterns as shown above, and by determining whether the current consumption value detected when each test pattern is applied is within the predetermined range.

Figure 5:
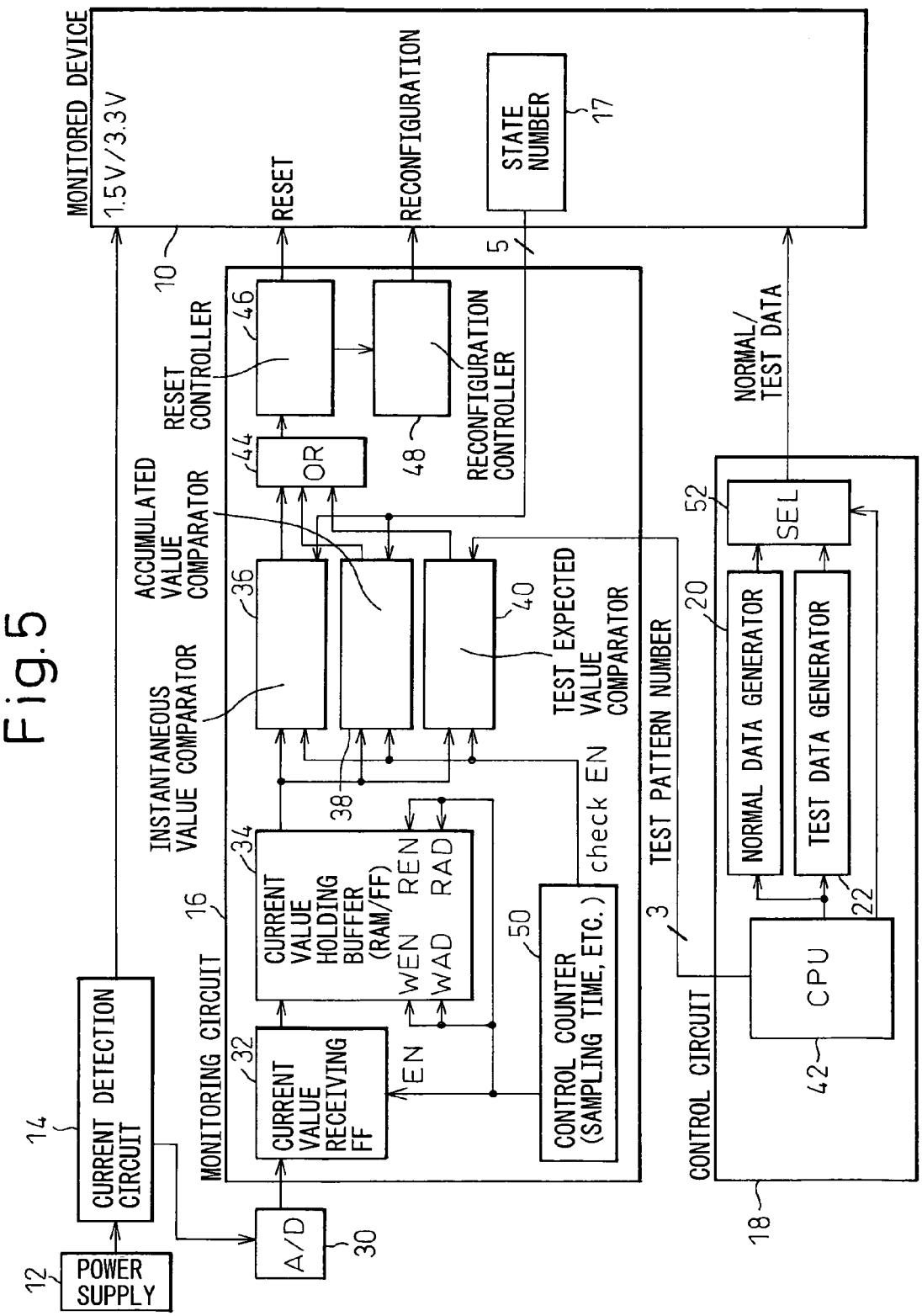
FIG. 5 is a block diagram showing one example of the detailed configuration of the system of FIG. 4.

FIG. 5 shows one example of the detailed construction of the system of FIG. 4. In FIG. 5, an electric current detection value as an analog signal detected by a current detection circuit 14 is converted by an analog/digital converter 30 into a digital value which is input to the monitoring circuit 16.

The detected electric current value input to the monitoring circuit 16 is first latched into a current value receiving flip-flop 32, and then is stored temporarily in a current value holding buffer 34 constructed from a RAM (random access memory) or a flip-flop. An instantaneous value comparator 36 determines the presence or absence of abnormality in operation by using the abnormality evaluation value shown, for example, in Table 1, based on the present electric current value stored in the current value holding buffer 34 and the state number output from the monitored device 10.

An accumulated value comparator 38 determines the presence or absence of abnormality in operation by using the abnormality evaluation value shown, for example, in Table 3 below, based on the state number and the electric current value held in the current value holding buffer 34.

TABLE 3

Examples of abnormality evaluation values used by accumulated value comparator 40

| Transition state | Monitoring time | Power consumption (mA) Set value (Expected value) |
|---|---|---|
| Shutdown state | 1 second | 0-20 (mA) |
| Shutdown state | 10 seconds | 0-200 (mA) |
| Shutdown state | 60 seconds | 0-1200 (mA) |
| ALC settled state 1, 2 | 1 second | 4000-5000 (mA) |
| ALC settled state 1, 2 | 10 seconds | 40000-50000 (mA) |
| ALC settled state 1, 2 | 60 seconds | 240000-300000 (mA) |
| AGC normal control state | 1 second | 6000-8000 (mA) |
| AGC normal control state | 10 seconds | 60000-80000 (mA) |
| AGC normal control state | 60 seconds | 360000-480000 (mA) |

In Table 3, the statement "Transition state: Shutdown state, Monitoring time: 10 seconds, and Set value: 0-200 (mA)" means that when the state is the shutdown state with the state number 1, if the total of 10 sampled values taken at intervals of 1 second (for 10 seconds) is within the range of 0 to 200 mA, then it is determined that the operation is normal.

A test expected value comparator 40 determines the presence or absence of abnormality in operation by using the abnormality evaluation value shown, for example, in Table 2, based on the electric current value stored in the current value holding buffer 34 and the test pattern number supplied from a CPU 42 in the control circuit 18.

An OR circuit 44 ORs the results of the comparisons output from the instantaneous value comparator 36, the accumulated value comparator 38, and the test expected value comparator 40, and outputs the result. A reset controller 46 sends a reset signal to the monitored device 10 based on the output of the OR circuit 44, while a reconfiguration controller 48 sends a reconfiguration commanding signal to the monitored device 10. A control counter 50 sends an enable signal, etc. to the current value receiving flip-flop 32, the current value holding buffer 34, and the comparators 36, 38, and 40 to control them.

The control circuit 18 contains the CPU 42 which controls a selector 52 for selecting one of the output of the normal data generator 20 or the output of the test data generator 22, and supplies the test pattern number to the test expected value comparator 40 in the monitoring circuit 16.

In Table 3, the accumulated value of the current consumption is monitored when the monitored device remains in the same state but, in addition to that, if provisions are made to accumulate the current consumption value for a predetermined period of time irrespective of the change in state and to compare the accumulated value with the set value to determine the presence or absence of abnormal operation, then an abnormality in which the state does not change while the current consumption is normal can be detected.

The current value holding buffer 34 is provided to buffer the value of the current consumption for a predetermined length of time in order to calculate the total current consumption value that is used in the accumulated value comparator 38. Accordingly, the instantaneous value comparator 36 and the test expected value comparator 40 may be constructed to take the measured value directly from the current value receiving flip-flop 32 and not via the current value holding buffer 34. The reason that the current value holding buffer 34 is placed before all the comparators regardless of their functions is to enable the comparators other than the accumulated value comparator 38 to expand their functions when needed, for example, when there arises a need to monitor abnormality using an electric current value averaged over a predetermined period of time by taking the electric current values including the past values up to the most recent value.

It is desirable that the abnormality evaluation values shown in Tables 1 to 3 be stored in a nonvolatile memory such as an externally connected flash memory. Then it becomes possible to measure the current consumption values during normal operation of each individual product before shipment of the product and to set the abnormality evaluation values unique to that product in accordance with the results of the measurements. Further, a temperature sensor for measuring the temperature of the monitored device may be provided to measure the current consumption values under different temperature conditions, and the abnormal evaluation values may be set for the different temperatures based on the results of the measurements.

Figure 6:
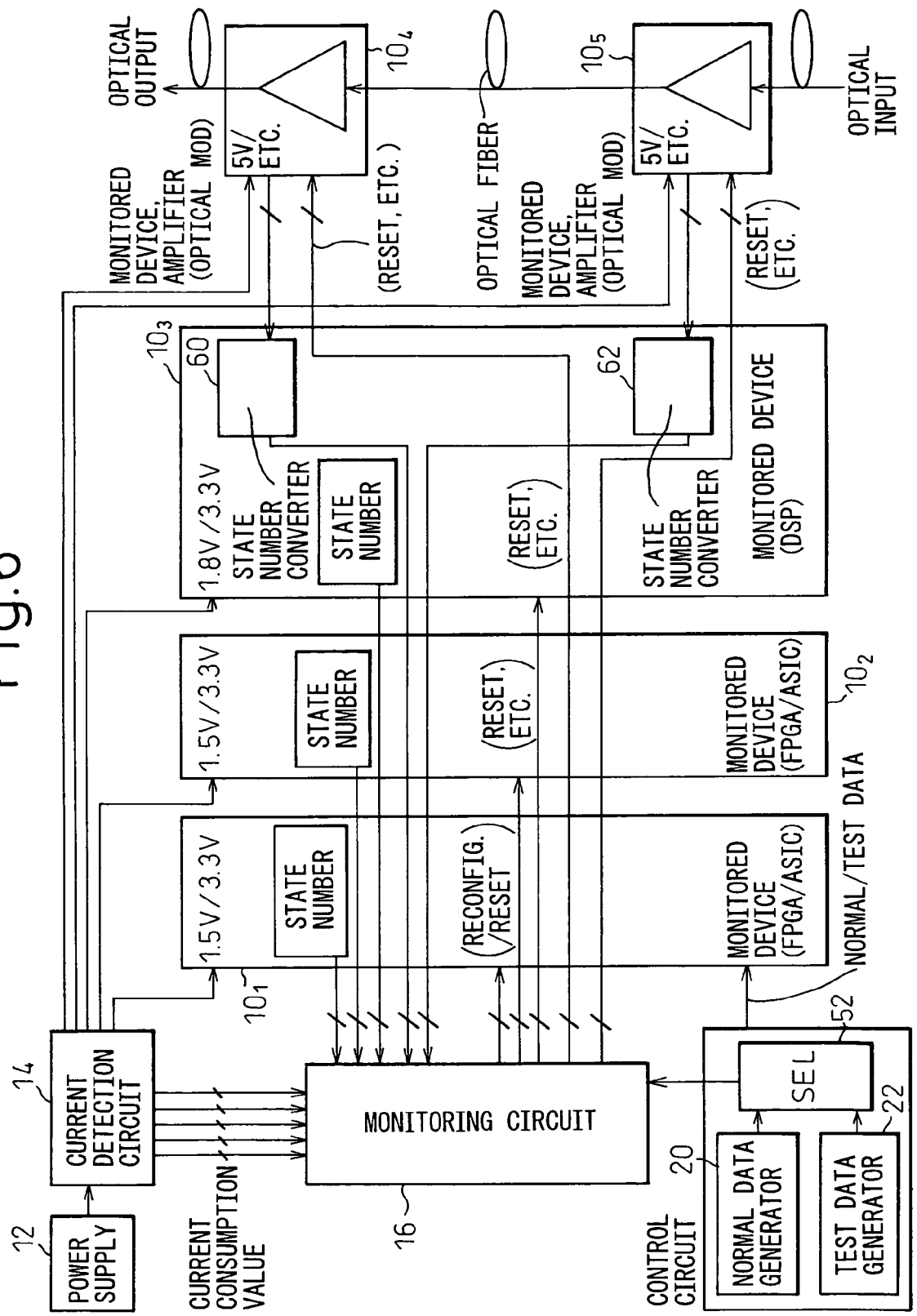
FIG. 6 is a block diagram showing an example in which a plurality of monitored circuits are monitored by one monitoring circuit.

FIG. 6 shows an example in which the current consumption values of a plurality of monitored devices $10_1$ to $10_5$ are monitored by one monitoring circuit 16. When the system is constructed to monitor the plurality of monitored devices by using one monitoring circuit, efficient and stable monitoring can be performed. Here, the monitored devices $10_4$ and $10_5$ are optical amplifiers for amplifying optical signals. In this case, signals indicating the states output from the respective monitored devices $10_4$ and $10_5$ are input to the monitored device $10_3$ which is a DSP (Digital Signal Processor), and the states are then converted by state number converters 60 and 62 in the DSP $10_3$ into the corresponding state numbers which are input to the monitoring circuit 16.

Figure 7:
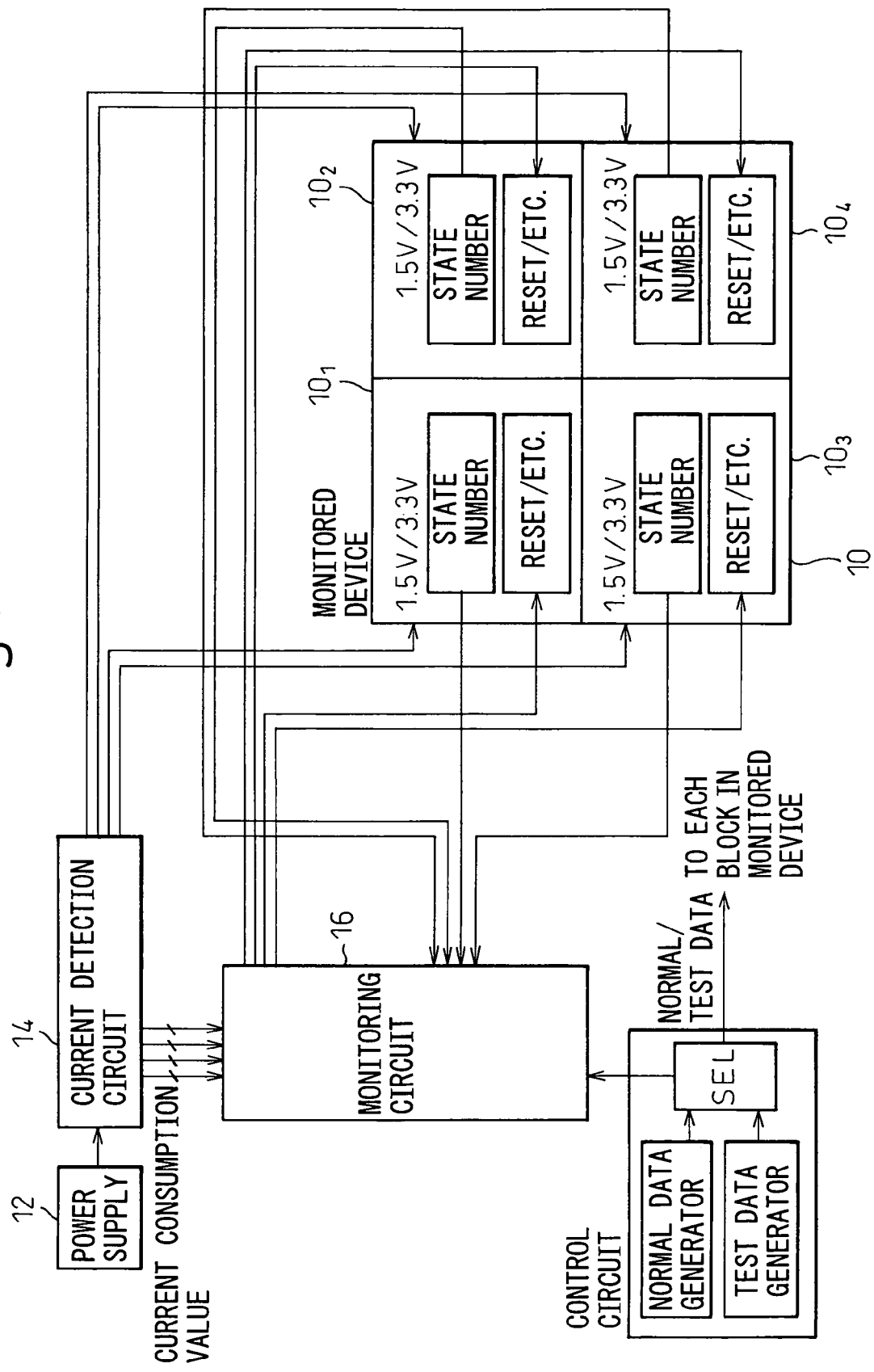
FIG. 7 is a block diagram showing an example in which the monitored circuit is divided into a plurality of blocks and each block is controlled independently of the others.

FIG. 7 shows an example in which the monitored device 10 is divided into a plurality of blocks $10_1$ to $10_4$ comprising independent state machines that are individually monitored by one monitoring circuit 16. The current consumption of each block is individually detected by the current detection circuit 14, and is monitored by the monitoring circuit 16 using the set values predetermined for each individual block. As the processing for restoration in the event of detection of abnormality is also performed independently for each individual block, the advantage is that the range of restoration is confined to within each block.

Figure 8:
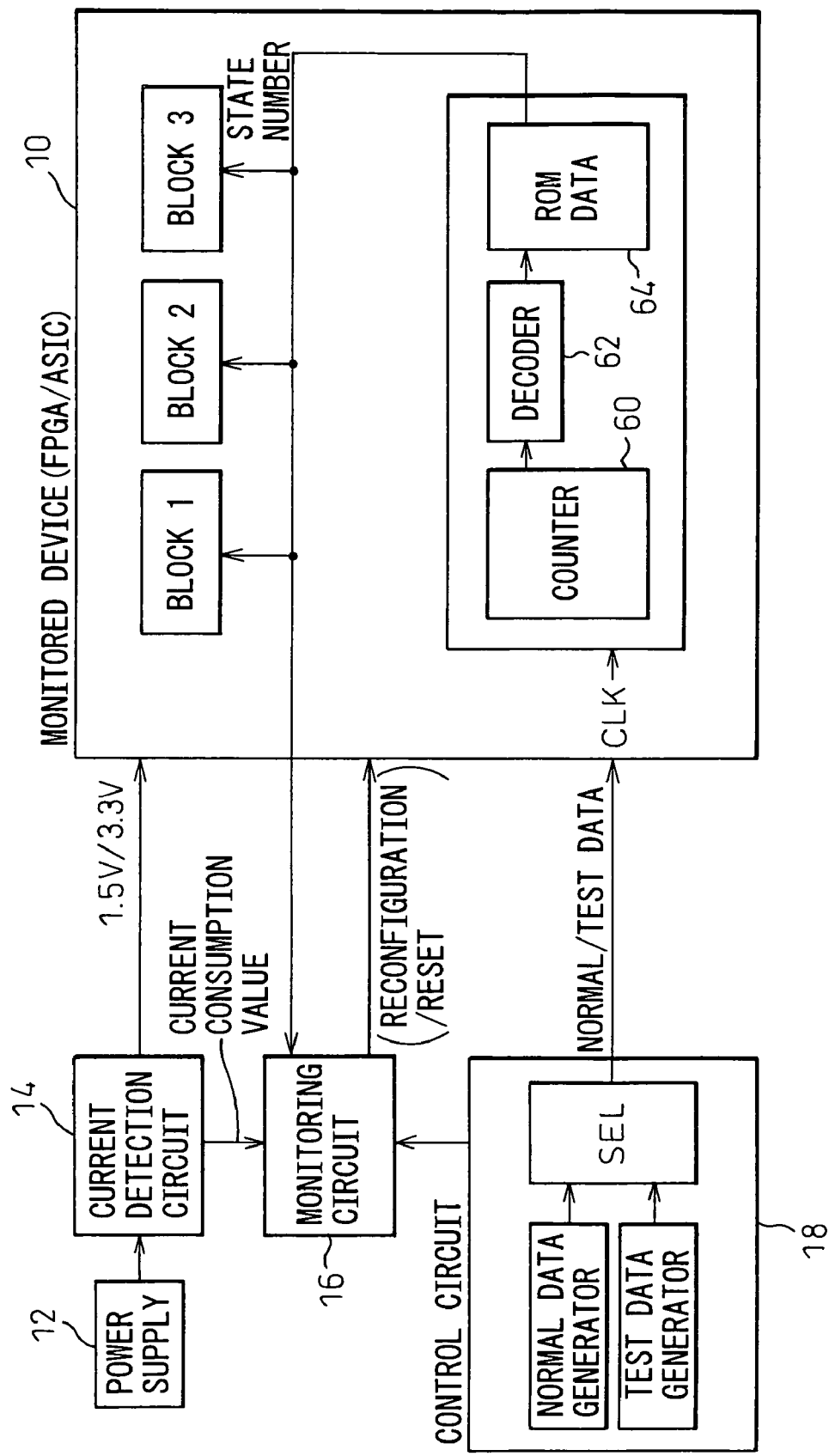
FIG. 8 is a block diagram showing a first example of a circuit for generating a state number.

FIG. 8 shows a first example of the circuit configuration for generating the state number within the monitored device 10. In FIG. 8, an output of a counter for counting a clock is decoded by a decoder 62 whose output is then given as an address to a ROM 64. Data read out of the ROM 64 is supplied as the state number to blocks 1 to 3 and output outside the monitored device 10. In this example, the state number is a function of the time elapsed from the last reset and is independent of the internal states of the blocks 1 to 3.

Figure 9:
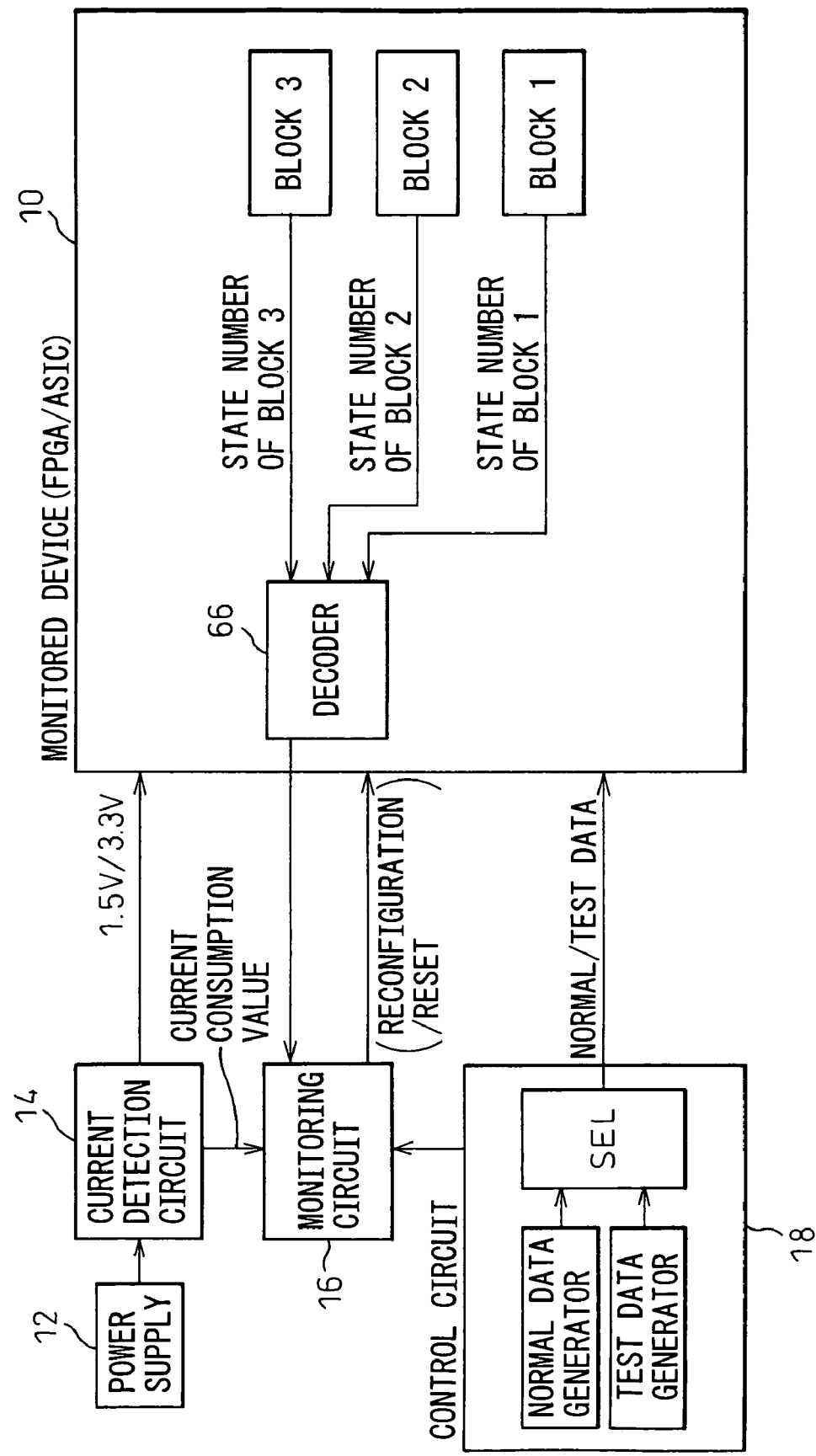
FIG. 9 is a block diagram showing a second example of a circuit for generating a state number.

FIG. 9 shows a second example of the circuit configuration for generating the state number. Blocks 1 to 3 are each constructed from a state machine, and the state number of each block is input to a decoder 66. The decoder 66 outputs the result of decoding the state numbers of the respective state blocks as the state number of the monitored device 10.

Figure 10:
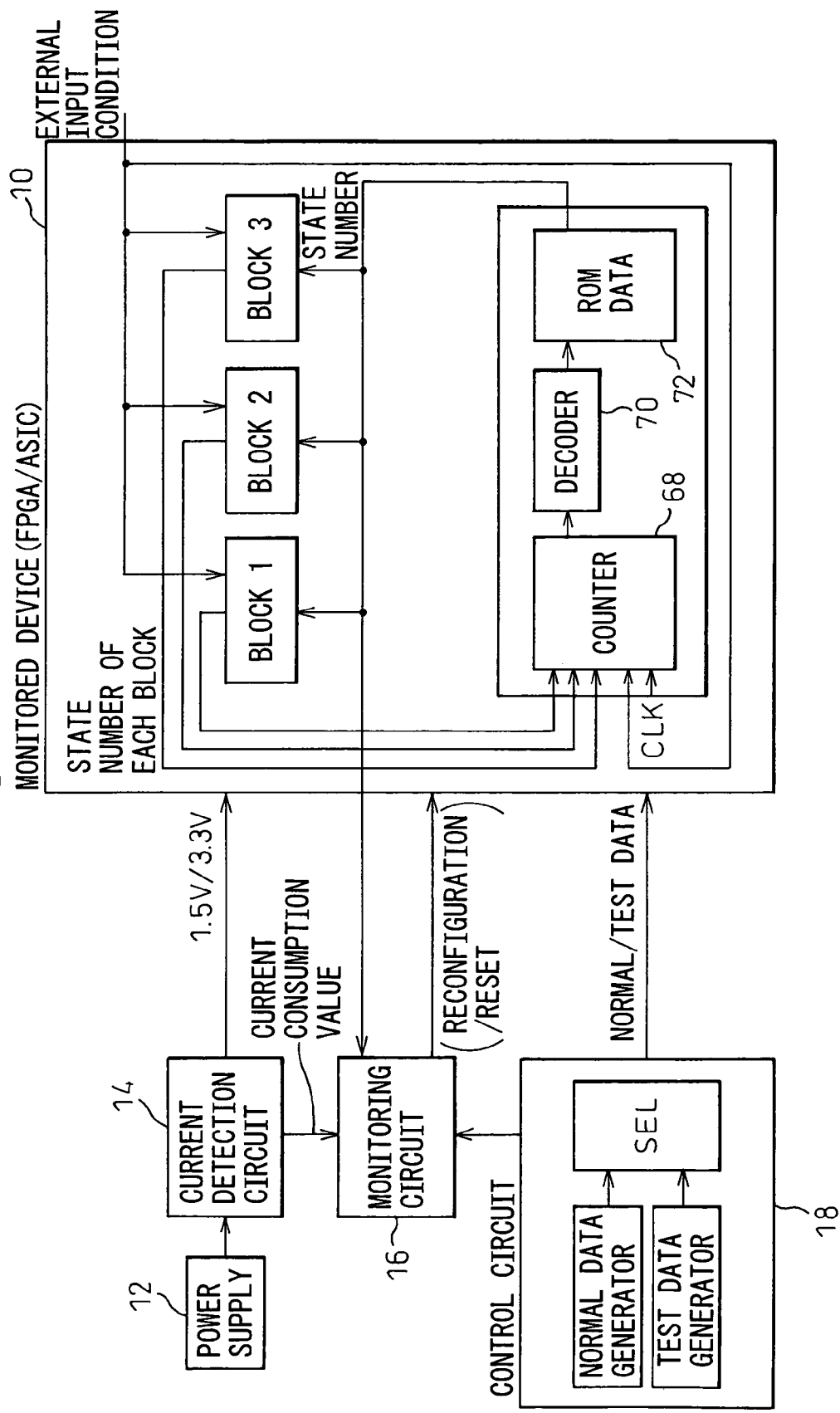
FIG. 10 is a block diagram showing a third example of a circuit for generating a state number.

FIG. 10 shows a third example of the circuit configuration for generating the state number. A counter 68, if no external input is applied, counts a clock and supplies its output to a decoder 70 whose output is then given as an address to a ROM 72. Data read out of the ROM 72 is supplied as the state number to the blocks 1 to 3 and output outside the monitored device 10. That is, when there is no external input, the operation is the same as that of the circuit shown in FIG. 8. When an external input is applied, the state numbers of the blocks 1 to 3 are loaded into the counter 68 which resumes counting by using the thus loaded value as the initial value.

The invention claimed is:

1. An abnormal operation detection system comprising:
a monitored integrated circuit device having a configuration of a state machine in which a plurality of states and conditions for state transitions are defined, said monitored integrated circuit device having a function to output a state number indicating a state of said state machine;
a power consumption detection circuit detecting power consumption of said monitored integrated circuit device; and
a monitoring circuit determining the presence or absence of abnormality in said detected power consumption by using an abnormality evaluation value corresponding to the state number output from said monitored integrated circuit device.

2. An abnormal operation detection system according to claim 1, wherein said monitoring circuit further determines the presence or absence of an abnormality in said power consumption by using accumulated power consumption values, which represent the value of the power consumption accumulated for a predetermined length of time irrespective of said state number, and an abnormality evaluation value predetermined for said accumulated power consumption values.

3. An abnormal operation detection system according to claim 1, further comprising a control circuit for sequentially supplying a plurality of test patterns to said monitored integrated circuit device, and wherein
said monitoring circuit further determines the presence or absence of an abnormality in said power consumption by using an abnormality evaluation value corresponding to the test pattern that said control circuit supplies to said monitored integrated circuit device.

4. The abnormal operation detection system according to claim 1, wherein said monitoring circuit has an external storage device storing an abnormality evaluation value for each state of said monitored integrated circuit device.

5. The abnormal operation detection system according to claim 1, further comprising a temperature sensor detecting a temperature on said monitored integrated circuit device, and wherein
said monitoring circuit further determines the presence or absence of an abnormality using an abnormality evaluation value corresponding to the temperature detected by said temperature sensor.

6. The abnormal operation detection system according to claim 1, wherein:
plural states, respective, expected ranges of values of power consumption are defined, in advance, and
the monitoring circuit monitors the current power consumption and compares each monitored value of power consumption with the expected range of power consumption for the current state number and, when the monitored power consumption is outside of the expected range for the current state number, resets the monitoring device to restore it to a normal condition.

7. A system, comprising:
a monitored integrated circuit device having a configuration of a state machine having internal states and conditions for state transitions of the monitored integrated circuit device and outputting numerical values indicating internal states of said monitored integrated circuit device;
a power consumption detection circuit detecting power consumption of said monitored integrated circuit device; and
a monitoring circuit determining abnormality in the power consumption by comparing abnormality values to the numerical values output from said monitored integrated circuit device.

8. The abnormal operation detection system according to claim 1, wherein the monitored integrated circuit device is selected from the group consisting of a Field Programmable Gate Array and an Application Specific Integrated Circuit.

\* \* \* \* \*